United States Patent
Li et al.

(10) Patent No.: US 10,041,974 B2
(45) Date of Patent: Aug. 7, 2018

(54) PROBE HEAD OF VERTICAL PROBE CARD

(71) Applicant: MPI Corporation, Hsinchu County (TW)

(72) Inventors: Tien-Chia Li, Hsinchu County (TW); Yi-Ching Chuo, Hsinchu County (TW)

(73) Assignee: MPI Corporation, Hsinchu County (TW)

( * ) Notice: Subject to any disclaimer, the term of this patent is extended or adjusted under 35 U.S.C. 154(b) by 0 days.

(21) Appl. No.: 15/260,326

(22) Filed: Sep. 9, 2016

(65) Prior Publication Data

US 2017/0122978 A1 May 4, 2017

(30) Foreign Application Priority Data

Oct. 28, 2015 (TW) .............................. 104135456 A

(51) Int. Cl.
*G01R 1/067* (2006.01)
(52) U.S. Cl.
CPC ................................ *G01R 1/06722* (2013.01)
(58) Field of Classification Search
CPC .......................... G01R 1/06722; G01R 1/0735
See application file for complete search history.

(56) References Cited

U.S. PATENT DOCUMENTS

| | | | | |
|---|---|---|---|---|
| 5,493,230 A | * | 2/1996 | Swart | G01R 1/07378 324/73.1 |
| 5,633,598 A | * | 5/1997 | Van Loan | G01R 1/07328 324/754.08 |
| 5,883,520 A | * | 3/1999 | Delfosse | G01R 1/07371 324/754.03 |
| 5,982,187 A | * | 11/1999 | Tarzwell | G01R 1/06722 324/72.5 |
| 6,034,532 A | * | 3/2000 | Tarzwell | G01R 1/06722 324/755.05 |
| 6,424,163 B1 | * | 7/2002 | Ott | G01R 1/07328 324/754.14 |
| 7,491,069 B1 | * | 2/2009 | Di Stefano | G01R 1/0491 439/74 |
| 2013/0057308 A1 | * | 3/2013 | Yano | G01R 3/00 324/755.01 |

FOREIGN PATENT DOCUMENTS

| | | |
|---|---|---|
| CN | 103901238 A | 7/2014 |
| CN | 203688607 U | 7/2014 |
| TW | I418820 B | 12/2013 |

* cited by examiner

*Primary Examiner* — Walter L Lindsay, Jr.
*Assistant Examiner* — Milton Gonzalez
(74) *Attorney, Agent, or Firm* — CKC & Partners Co., Ltd.

(57) ABSTRACT

A probe head includes a probe base, a film, and a probe assembly. The probe base includes first, second, and third guiding boards. The second guiding board is fixed between the first and third guiding boards. The film is fixed to the probe base and has a hole. The probe assembly passes through the first, second, and third guiding boards and the hole, and includes a probe and an outer spring sleeve. The probe has a tip passing out through the third guiding board. The outer spring sleeve is sleeved at the exterior of the probe and has a spring area and a plurality of non-spring areas. The spring area is disposed between adjacent two of the non-spring areas. One of the non-spring areas has a bonding section mounted to the probe and retained between the third guiding board and the film.

7 Claims, 8 Drawing Sheets

PROBE HEAD OF VERTICAL PROBE CARD

RELATED APPLICATIONS

This application claims priority to Taiwan Application Serial Number 104135456, filed Oct. 28, 2015, which is herein incorporated by reference.

BACKGROUND

Technical Field

The present disclosure relates to a probe head, and more particularly, to a probe head of a vertical probe card.

Description of Related Art

While testing a semiconductor chip, tester uses a probe card to electrically connect a DUT (Device Under Test) and obtain testing results of the DUT through signal transmission and signal analysis. A conventional probe card is usually constituted by a circuit board and a probe head, or further includes a space transformer disposed between the circuit board and the probe head. The probe head is equipped with a plurality of probes arranged to correspond to electrical contacts of the DUTs, so as to contact the electrical contacts with the probes at the same time.

FIG. 10 is an exploded view of a conventional probe assembly 71. The probe assembly 71 includes a probe 710 and a spring sleeve 711 sleeved at the exterior of the probe 710. FIG. 11 is a partial cross-sectional view of a probe card adopted in the probe assembly 71. For convenience of explanation, the geometric proportions of components in FIG. 11 are not corresponded with those in FIG. 10. The probe card includes a probe head 7 and a circuit substrate 8. The probe head 7 includes a probe base 70 and a plurality of probe assemblies 71 (FIG. 11 only shows one of the probe assemblies 71). The circuit substrate 8 can be a circuit board used to electrically connect a tester (not shown). Alternatively, the circuit substrate 8 can be a space transformer and is disposed between a circuit board (not shown) used to electrically connect a tester (not shown) and the probe head 7.

The approach for bonding the probe 710 and the spring sleeve 711 of the probe assembly 71 is pressing a bonding section 711a at the lower end of the spring sleeve 711 to the probe 710 and then fixing the bonding section 711a and the probe 710 by welding (e.g., spot welding). The probe base 70 is constituted by an upper guiding board 700, a middle guiding board 701, and a lower guiding board 702 (or the middle guiding board 701 can be omitted). The guiding boards form a plurality of installation holes 703 (FIG. 11 only shows one of the installation holes 703). Each of the installation holes 703 is constituted by an upper guiding hole 700a of the upper guiding board 700, a middle guiding hole 701 of the middle guiding board 701, and a lower guiding hole 702a of the lower guiding board 702, and is used to install one of the probe assemblies 71. The bonding section 711a of the spring sleeve 711 turns towards the upper guiding board 700 and sequentially passes through the upper guiding hole 700a of the upper guiding board 700 and the middle guiding hole 701a of the middle guiding board 701, so as to be installed in the lower guiding hole 702a of the lower guiding board 702. The lower end of the probe 710 passes through a through hole 702b of the lower guiding board 702, so that the meanwhile, the bottom surface of the bonding section 711a of the spring sleeve 711 is supported on the bottom surface of the lower guiding hole 702a of the lower guiding board 702. Therefore, the probe assembly 71 can be maintained in the upper guiding board 700, the middle guiding board 701, and the lower guiding board 702 without falling.

However, while assembling or repairing the above-mentioned probe head 7, following problems often occur. Problem (1): if the probe head 7 is turned over (i.e., the upper guiding board 700 is located under the lower guiding board 702), all of the probe assemblies 71 will fall out of the probe base 70. Hence, the circuit substrate 8 must be tilted or placed upside down (i.e., make the surface of the circuit substrate 8 used to contact the probe head 7 face downwards) while assembling or repairing, which may increase assembling time or repairing time. Problem (2): while disassembling the probe head 7 the tails of the assemblies 71 are adhered to the electrical contacts on the circuit substrate 8 and fall out of the probe base 70. Problem (3): the guiding holes 700a, 701a, and 702a of the guiding boards 700, 701 and 702 are manufactured before the assembling of the guiding boards 700, 701, and 702, so assembly errors or machining errors may occur to the guiding holes 700a, 701a, and 702a, which makes the inner wall of the installation hole 703 uneven. Hence, the probe assembly 71 may got stuck while being placed into the installation hole 703 and needs to be pressed or patted at the tail by using tweezers. However, during the pressing or patting, the probe assembly 71 may popped out of the installation hole 703 (due to the elastic force generated by the spring sleeve 711) when the tweezers leave the tail of the probe assembly 71. Problem (4): While cleaning the tail of the probe assembly 71, the probe assembly 71 may also popped out of the installation hole 703 when a brush presses the tail of the probe assembly 71. Problem (5): the position of the junction 704 of the upper guiding board 700 and the middle guiding board 701 is corresponded with one of spring sections 711b of the spring sleeve 711, and the position of the junction 705 of the middle guiding board 701 and, the lower guiding board 702 is corresponded with another of the spring sections 711b of the spring sleeve 711. If the junctions 704 and 705 are not flushed with each other due to the assembly errors of the guiding boards 700, 701 and 702 and thus makes the inner wall of the installation hole 703 be uneven, the spring sections 711b may easily got stuck at the uneven junctions 704 and 705. As a result, the probe assembly 71 needs to be repaired, which is difficult and time consuming.

SUMMARY

Accordingly, an aspect of the disclosure is to provide a probe head to solve above-mentioned problems.

According to an embodiment of the disclosure, the probe head includes a probe base, a film, and a probe assembly. The probe base includes a first guiding board, a second guiding board, and a third guiding board. The second guiding board is disposed between the first guiding board and the third guiding board. The first guiding board has at least one first guiding hole. The second guiding board has at least one second guiding hole. The third guiding board has at least one third guiding hole. The film is fixed to the probe base and has hole, the second guiding hole, the third guiding hole, and the at least one micro hole. The probe assembly includes a probe and an outer spring sleeve. The probe has a tip passing out through the third guiding board. The outer spring sleeve is sleeved at the exterior of the probe and has at least one spring area and a plurality of non-spring areas. The at least one spring area is disposed between adjacent two of the non-spring areas. One of the non-spring areas has a bonding section mounted to the probe and retained between the third guiding board and the film. The third guiding hole is configured to allow the tip to pass through and block the outer spring sleeve.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
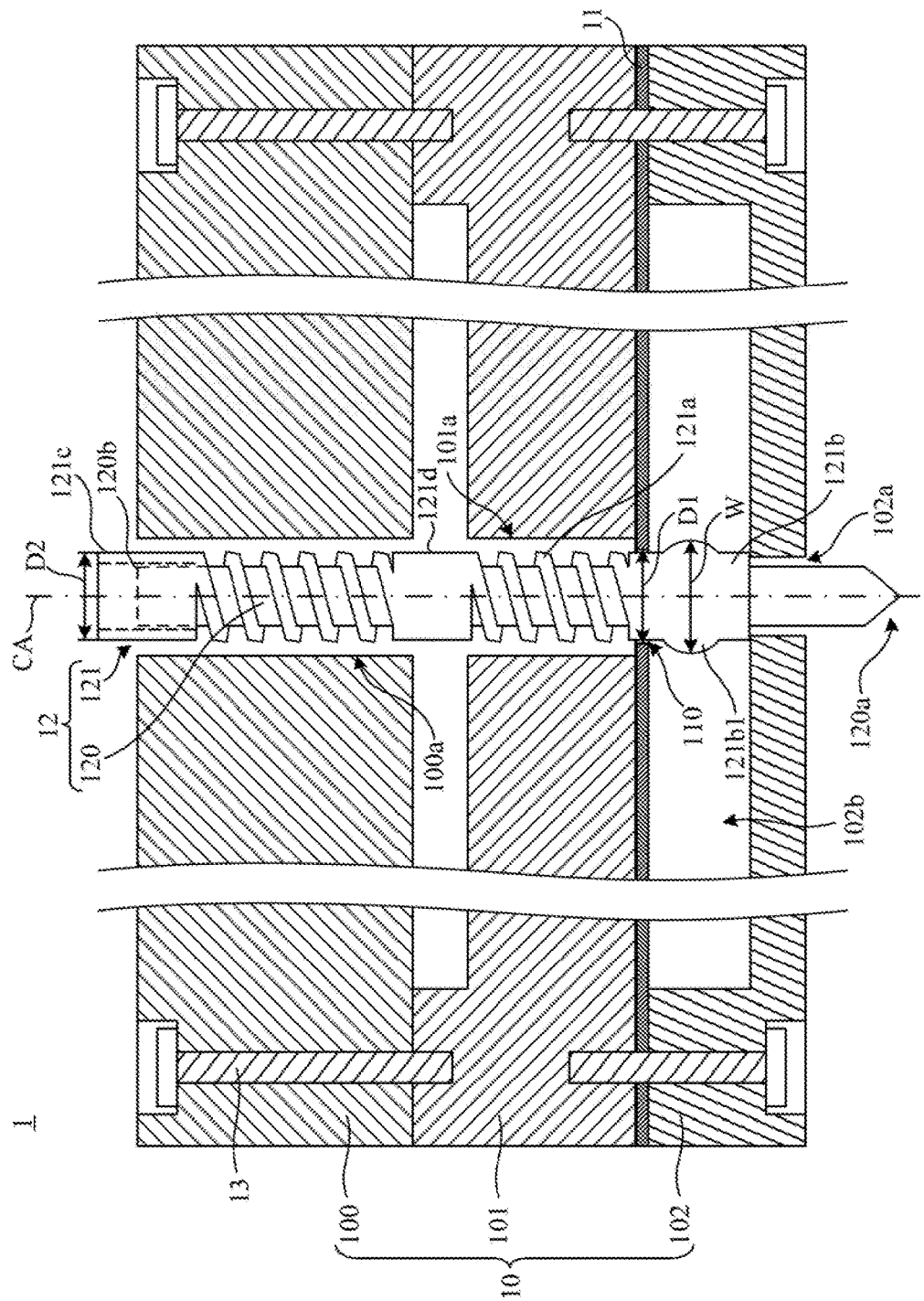
FIG. 1 is a cross-sectional view of a probe head according to an embodiment of the disclosure.

Reference will now be made in detail to the present embodiments of the disclosure, examples of which are illustrated in the accompanying drawings. Wherever possible, the same reference numbers are used in the drawings and the description to refer to the same or like parts.

Reference is made to FIG. 1. FIG. 1 is a cross-sectional view of a probe head 1 according to an embodiment of the disclosure. As shown in the figure, in the embodiment, the probe head 1 includes a probe base 10, a film 11, a plurality of probe assemblies 12 (FIG. 1 only shows one of the probe assemblies 12), and a plurality of fastening members 13. The structures and functions of the components and connection relationships among the components are introduced in detail below.

The probe base 10 includes a first guiding board 100, a second guiding board 101 and a third guiding board 102. The second guiding board 101 is disposed between the first guiding board 100 and the third guiding board 102. For example, in the embodiment, the fastening members 13 respectively pass through the first guiding board 100 and the third guiding board 102 and are fastened to the second guiding board 101, so as to respectively fix the first guiding board 100 and the third guiding board 102 to opposite sides of the second guiding board 101. However, the approach of fixing the first guiding board 100, the second guiding board 101, and the third guiding board 102 of the disclosure is not limited in this regard. For example, the first guiding board 100, the second guiding board 101 and the third guiding board 102 can also be fixed to each other by adhesion. In some other embodiments, the number of the guiding boards included in the probe base 10 can be greater than three.

The first guiding board 100 has at least one first guiding hole 100a. The second guiding board 101 has at least one second guiding hole 101a. The third guiding board 102 has at least one third guiding hole 102a. The first guiding hole 100a, the second guiding hole 101a, and the third guiding hole 102a form an installation hole for installing the probe assembly 12.

The film 11 is fixed to the probe base 10 and has at least one micro hole 110. Specifically, the film 11 is located between the second guiding board 101 and the third guiding board 102. For example, the film 11 can be fixed between the second guiding board 101 and the third guiding board 102 by the fastening members 13 which fasten the second guiding board 101 and the third guiding board 102, but the disclosure is not limited in this regard. In practical applications, the film 11 can be adhered to the second guiding board 101 or the third guiding board 102. The film 11 can be a flexible substrate.

In the embodiment, the probe assembly 12 sequentially passes through the first guiding hole 100a of the first guiding board 100, the second guiding hole 101a of the second guiding board 101, the micro hole 110 of the film 11, and the third guiding hole 102a of the third guiding board 102. The probe assembly 12 includes a probe 120 and an outer spring sleeve 121. The probe 120 includes a tip 120a and a tail 120b. The tip 120a of the probe 120 passes out through the third guiding hole 102a of the third guiding board 102. The outer spring sleeve 121 is sleeved at the exterior of the probe 120 and has at least one spring area 121a and a plurality of non-spring areas (e.g., a first non-spring area 121b and a second non-spring area 121c). The first non-spring area 121b has a bonding section 121b1. The bonding section 121b1 is mounted to the probe 120 and located between the tip 120a and the film 11. The first non-spring area 121b can be regarded as a bonding non-spring area of the outer spring sleeve 121 for bonding the probe 120. The second non-spring area 121c is sleeved at the exterior of the tail 120b. The second non-spring area 121c can be regarded as a non-bonding non-spring area of the outer spring sleeve 121. The non-bonding non-spring area refers to the non-spring area which is not mounted to the probe 120 (i.e., the non-spring area does not have the bonding section 121b1). The spring area 121a is located between the first non-spring area 121b and the second non-spring area 121c. That is, the spring area 121a is disposed between adjacent two of the non-spring areas.

In practical applications, the first non-spring area 121b and the probe 120 can be fixed to each other by inwardly pressing the bonding section 121b1 onto the probe 120 and then welding (e.g., laser beam welding, arc welding, and etc.). Alternatively, the first non-spring area 121b and the probe 120 can be fixed to each other by other approaches such as using adhesives.

In detail, the first guiding hole 100a of the first guiding board 100 and the second guiding hole 101a of the second guiding board 101 allow the probe assembly 12 to pass through. The third guiding hole 102a of the third guiding board 102 allows the tip 120a of the probe 120 to pass through and blocks the outer spring sleeve 121. Therefore, when the outer spring sleeve 121 is installed in the installation hole of the probe base 10, the first non-spring area 121b of the outer spring sleeve 121 abuts against a surface of the third guiding board 102 facing the second guiding board 101, and the tip 120a of the probe 120 passes through the third guiding hole 102a of the third guiding board 102 to expose out of the third guiding board 102. In the meanwhile, the bottom surface of the first non-spring area 121b is supported on the third guiding board 102. Hence, the probe assembly 12 can be maintained at a side of the third guiding board 102 facing the second guiding board 101.

On the other hand, the bonding section 121b1 of the first non-spring area 121b is located between the tip 120a of the probe 120 and the film 11. Specifically, the bonding section 121b1 of the first non-spring area 121b has a width W in a direction perpendicular to the central axis CA of the probe 120, the spring area 121a and the second non-spring area 121c have an outer diameter D2 in a direction perpendicular to the central axis CA, and a hole diameter D1 of the micro hole 110 is greater than the outer diameter D2. Therefore, after the probe assembly 12 is installed in the installation hole of the probe base 10, the bonding section 121b1 of the first non-spring area 121b is retained between the third guiding board 102 and the film 11, so as to prevent the probe assembly 12 from falling out of the installation hole of the probe base 10. In addition, the third guiding board 102 has an accommodating space 102b at a side facing the second guiding board 101, so as to accommodate the boding sections 121b1 of the plurality of probe assemblies 12.

Figure 2:
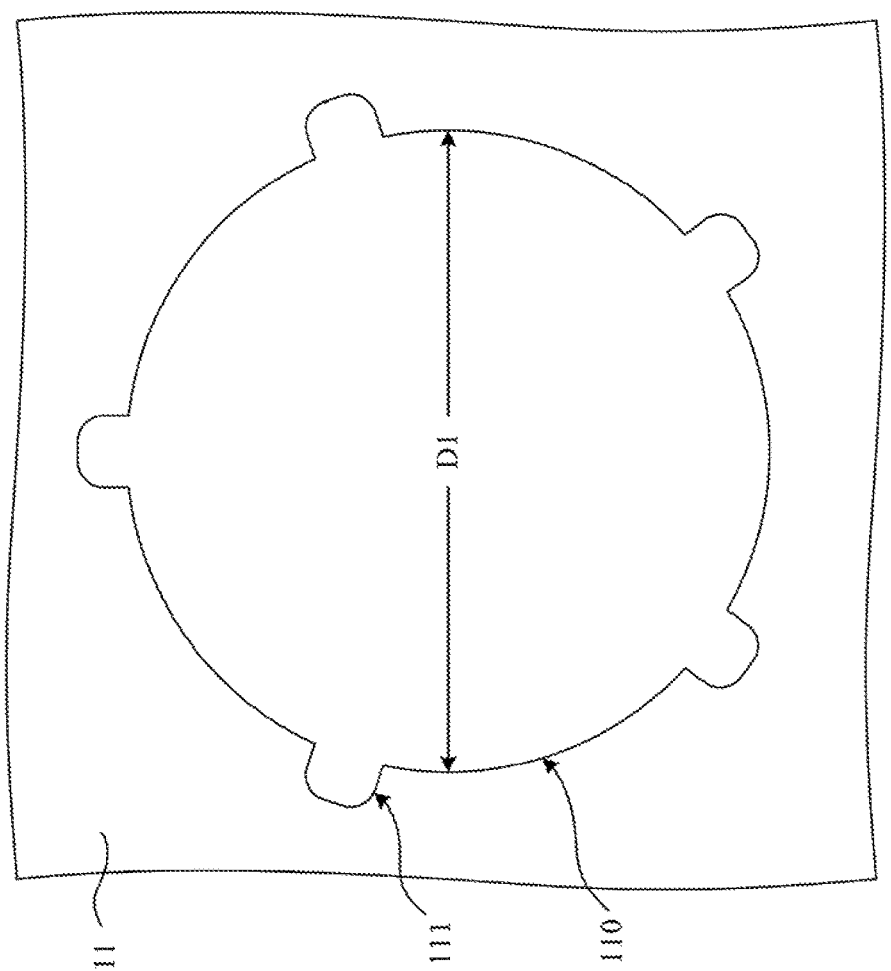
FIG. 2 is a partial top view of the film in FIG. 1.

Reference is made to FIG. 2. FIG. 2 is a partial top view of the film 11 in FIG. 1. As shown in the figure, in the embodiment, the film 11 further has a plurality of recesses 111, and the recesses 111 are equidistantly formed at the inner wall of the micro hole 110. Under the structural configuration, to install probe assembly 12 into the installation hole of the probe base 10, the bonding section 121b1 of the first non-spring area 121b can be turned towards the first guiding board 100 to sequentially pass through the first guiding hole 100a of the first guiding board 100, the second guiding hole 101a of the second guiding board 101, and the micro hole 110 of the film 11 (the recesses 111 allow the micro hole 110 to expand when the micro hole 110 is extruded by the bonding section 121b1), so that bonding section 121b1 can reach the side of the third guiding board 102 facing the second guiding board and be retained between the third guiding board 102 of the probe base 10 and the film 11 (the micro hole 110 returns to its original size at this moment). Moreover, the micro hole 110 of the film 11 not only can produce a positioning effect to the first non-spring area 121b of the probe assembly 12, but also can prevent the spring area 121a of the outer spring sleeve 121 from getting stuck in the installation hole due to the unevenness at the inner wall (e.g., the guiding holes of any adjacent two guiding boards are not flushed with each other at the junction caused by the assembly errors) of the installation hole.

As shown in FIG. 1, in the embodiment, the film 11 is located between the third guiding board 102 and the second guiding board 101. In other words, the film 11 is very close to the bonding section 121b1 of the first non-spring area 121b. Therefore, even if the probe head 1 in FIG. 1 is turned upside down while assembling or repairing, the stroke that the probe assembly 12 leaves the installation hole of the probe base 10 can be effectively reduced.

It should be pointed out that the number of the non-spring areas can be more than two. For example, as shown in FIG. 1, the outer spring sleeve 121 further includes a third non-spring area 121d located between the first non-spring area 121b and the second non-spring area 121c, and any adjacent two non-spring areas are connected to each other through a spring area 121a. In the embodiment, the third non-spring area 121d can be regarded as another non-bonding non-spring area of the outer spring sleeve 121.

Figure 3:
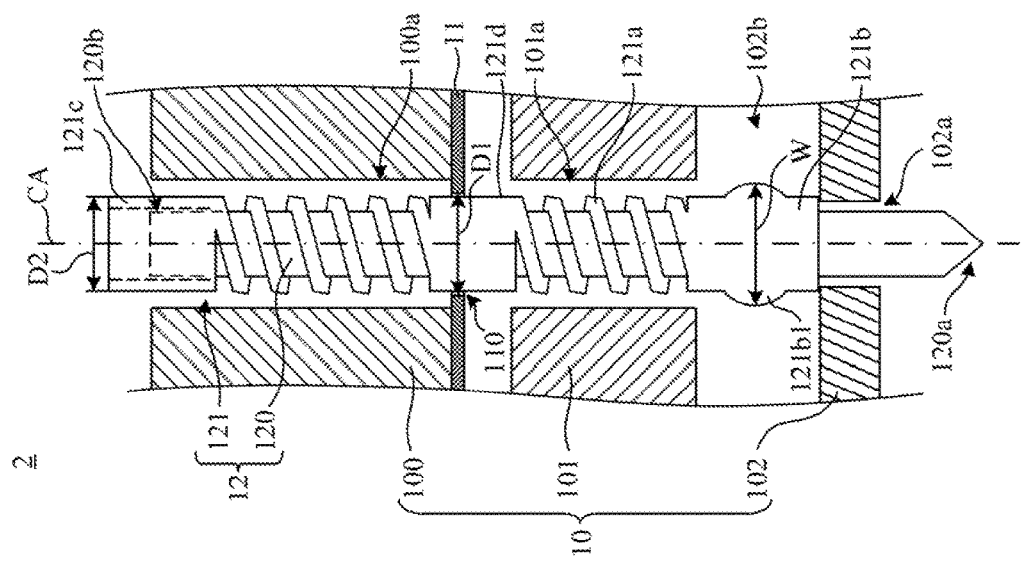
FIG. 3 is a partial cross-sectional view of a probe head according to another embodiment f the disclosure.

However, the position of the film 11 in the probe base 10 is not limited by the embodiment of FIG. 1. Reference is made to FIG. 3. FIG. 3 is a partial cross-sectional view of a probe head 2 according to another embodiment of the disclosure. As shown in the figure, compared with the probe head 1 shown in FIG. 1, the film 11 of the probe head 2 of the embodiment is located between the first guiding board 100 and the second guiding board 101. For example, the film 11 can be fixed between the first guiding board 100 and the second guiding board 101 by using the fastening member 13 (referring to FIG. 1) which fasten the first guiding board 100 to the second guiding board 101. Under the circumstances that the outer spring sleeve 121 abuts against the third guiding board 102 the film 11 is located at the third non-spring area 121d, but the disclosure is not limited in this regard. In practical applications, the film 11 can be adhered to the first guiding board 100 or the second guiding board 101.

Moreover, the micro hole 110 of the film 11 not only can produce a positioning effect to the third non-spring area 121d of the probe assembly 12, but also can prevent the spring area 121a of the outer spring sleeve 121 from getting stuck in the installation hole due to the unevenness at the inner wall (e.g., the guiding holes of any adjacent two guiding boards are not flushed with each other at the junction caused by the assembly errors) of the installation hole. The structures and functions of other components included in the probe head 2 of the present embodiment and relationships among the components are similar to those of the probe head 1 of FIG. 1 and therefore are not repeated here to avoid duplicity.

In some embodiments the bonding non-spring area can be the first non-spring area 121b or the third non-spring area 121d. For example, as shown in FIG. 3, if the third non-spring area 121d is the bonding non-spring area (i.e., the third non-spring area 121d also has the bonding section 121b1) the bonding section 121b1 of the third non-spring area 121d is also retained between the third, guiding board 102 of the probe base 10 and the film 11 but the bonding section 121b1 of the third non-spring area 121d is closer to the film 11. Therefore, when even if the probe head 2 is turned upside down while assembling or repairing, the stroke that the probe assembly 12 leaves the installation hole of the probe base 10 can be effectively reduced by the bonding section 121b1 of the t hied non-spring area 121d.

In an embodiment, the quantity of the recesses 111 at the inner wall of the micro hole 110 is an odd number. When there are a plurality of the micro holes 110 on the film 11 and under the circumstances that a distance between the centers of any adjacent two micro holes 110 is constant and orientations of the micro holes 110 are the same, the result that the smallest distant between adjacent two micro holes 110 each having an odd number of the recesses 111 is greater than the smallest distant between adjacent two micro holes 110 each having an even number of the recesses 111 after simulation and estimation. Hence, the film 11 having the micro holes 110 each having an odd number of the recesses 111 is not easily broken.

Figure 4:
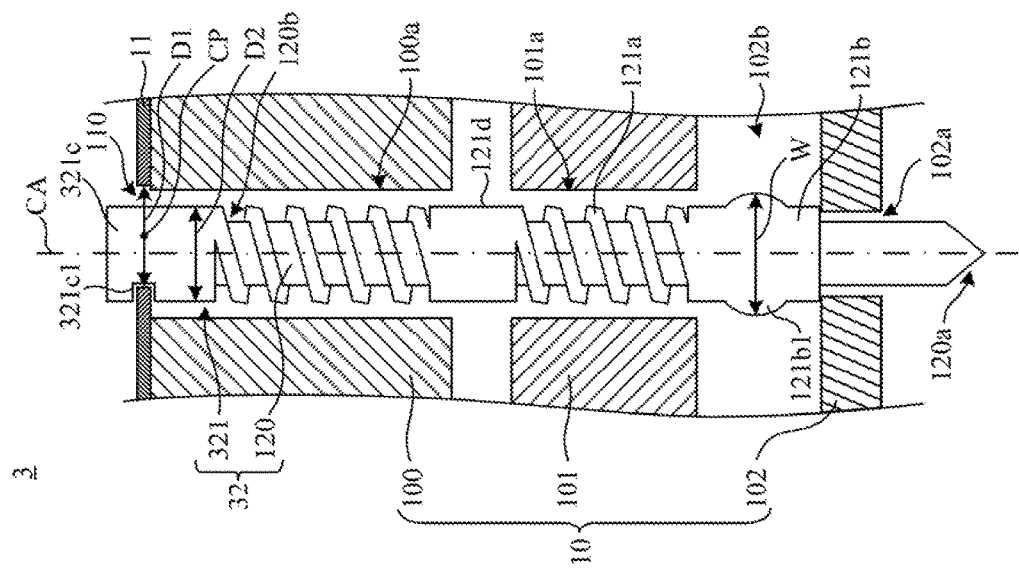
FIG. 4 is a partial cross-sectional view of a probe head according to another embodiment of the disclosure.

Reference is made to FIG. 4. FIG. 4 is a partial cross-sectional view of a probe head 3 according to another embodiment of the disclosure. As shown in the figure, compared with the probe head 1 shown in FIG. 1, the film 11 of the probe head 3 of the embodiment is located at a side of the first guiding board 100 away from the second guiding board 102, and the film 11 is located at the second non-spring area 321c under the circumstances that the outer spring sleeve 321 abuts against the third guiding board 102. Moreover, the structure of the outer spring sleeve 321 of the probe assembly 32 of the embodiment is modified. Specifically, in the embodiment, the second non-spring area 321c of the outer spring sleeve 321 of the probe assembly 32 has a groove 321c1 and the micro hole 110 has a central point CP. The central point CP of the micro hole 110 is not aligned with the central axis CA of the probe 120, and a part of the film 11 adjoining the micro hole 11 is engaged with the groove 321c1 of the second non-spring area 321c (similar to the fixing mechanism of latch). The above structural configuration also can achieve the purposes of retaining the bonding section 121b1 of the first non-spring area 121b between the third guiding board 102 of the probe base 10 and the film 11 and preventing the probe assembly 32 from falling out of the installation hole of the probe base 10.

Based on the above structural configuration, the assembly of the probe head 3 (i.e., installing the probe assembly 32 into the installation hole of the probe base 10) can be accomplished by steps of: aligning the central point CP of the micro hole 110 with the central axis CA of the probe 120; passing the probe assembly 32 through the micro hole 110; moving the film 11 to make the central point CP of the micro hole 110 be not aligned with the central axis CA of the probe 120; and fixing the film 11 to the first guiding board 100 (e.g., by using the fastening members 13 in FIG. 1).

The structures and functions of other components included in the probe head 3 of the present embodiment and relationships among the components are similar to those of the probe head 1 of FIG. 1 and therefore are not repeated here to avoid duplicity.

In practical applications, the groove 321c1 disposed at the second non-spring area 321c can be modified to be disposed at the third non-spring area 121d in line with disposing the film 11 between the first guiding board 100 and the second guiding board 101. Alternatively, the groove 321c1 disposed at the second non-spring area 321c can be modified to be disposed at the first non-spring area 121b in line with disposing the film 11 between the second guiding board 101 and the third guiding board 102. As a result, the purpose of preventing the probe assembly 32 from falling out of the installation hole of the probe base 10 can also be achieved by using the film 11.

Figure 6:
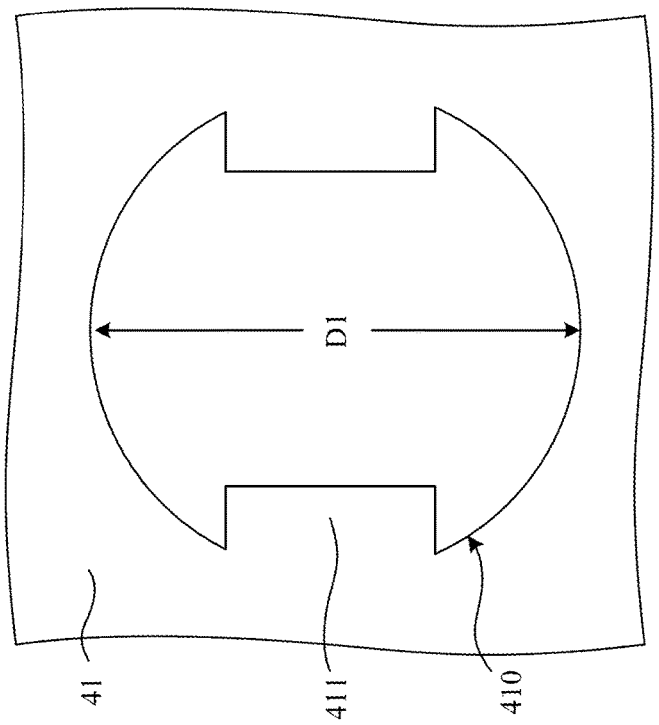
FIG. 6 is a partial, top view of the film in FIG. 5.
Figure 5:
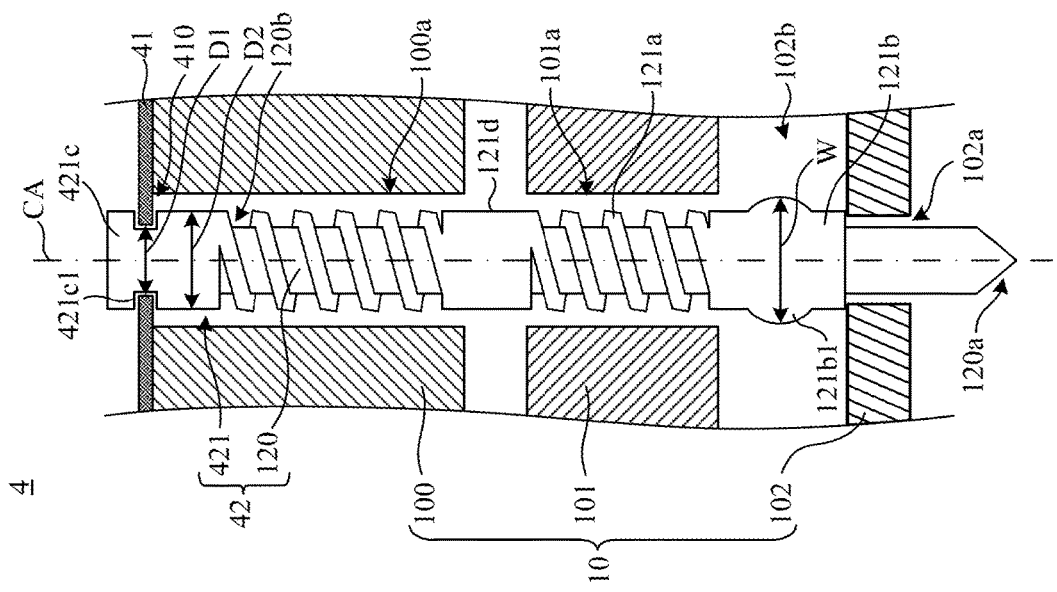
FIG. 5 is a partial cross-sectional view of probe head according to another embodiment of the disclosure.

Reference is made to FIGS. 5 and 6. FIG. 5 is a partial cross-sectional view of a probe head 4 according to another embodiment of the disclosure. FIG. 6 is a partial top view of the film 41 in FIG. 5. As shown in the figures, compared with the probe head 1 shown in FIG. 1, the film 41 of the probe head 4 of the embodiment is located at a side of the first guiding board 100 away from the second guiding board 101, and the structures of the film 41 and the outer spring sleeve 421 of the probe assembly 42 of the embodiment modified. Specifically, in the embodiment, two opposite sides of the second non-spring area 421c of the outer spring sleeve 421 of the probe assembly 42 respectively have two grooves 421c1, and the film 41 correspondingly has two extending portions 411 formed at the inner wall of the micro hole 410 (similar to the design of a diving board), so as to respectively engage the grooves 421c1 (similar to the fixing mechanism of latch). The above structural configuration also can achieve the purposes of retaining the bonding section 121b1 of the first non-spring area 121b between the third guiding board 102 of the probe base 10 and the film 41 and preventing the probe assembly 42 from falling out of the installation hole of the probe base 10.

The structures and functions of other components included in the probe head 4 of the present embodiment and relationships among the components are similar to those of the probe head 1 of FIG. 1 and therefore are not repeated here to avoid duplicity.

In practical applications, the grooves 421c1 disposed at the second non-spring area 421c can be modified to be disposed at the third non-spring area 121d in line with disposing the film 41 between the first guiding board 100 and the second guiding board 101. Alternatively, the grooves 421c1 disposed at the second non-spring area 421c can be modified to be disposed at the first non-spring area 121b in line with disposing the film 41 between the second guiding board 101 and the third guiding board 102. As a result, the purpose of preventing the probe assembly 42 from falling out of the installation hole of the probe base 10 can also be achieved by using the film 41.

Figure 8:
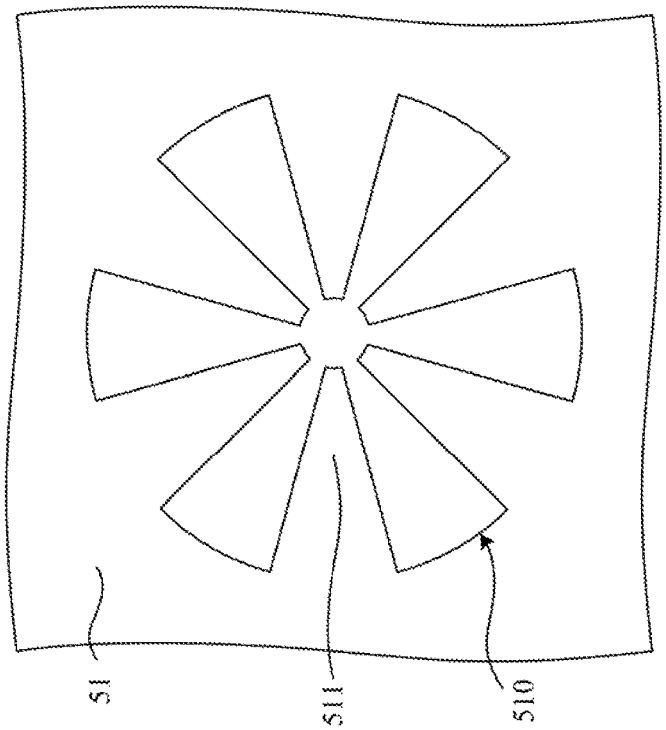
FIG. 8 is a partial top view of the film in FIG. 7.
Figure 7:
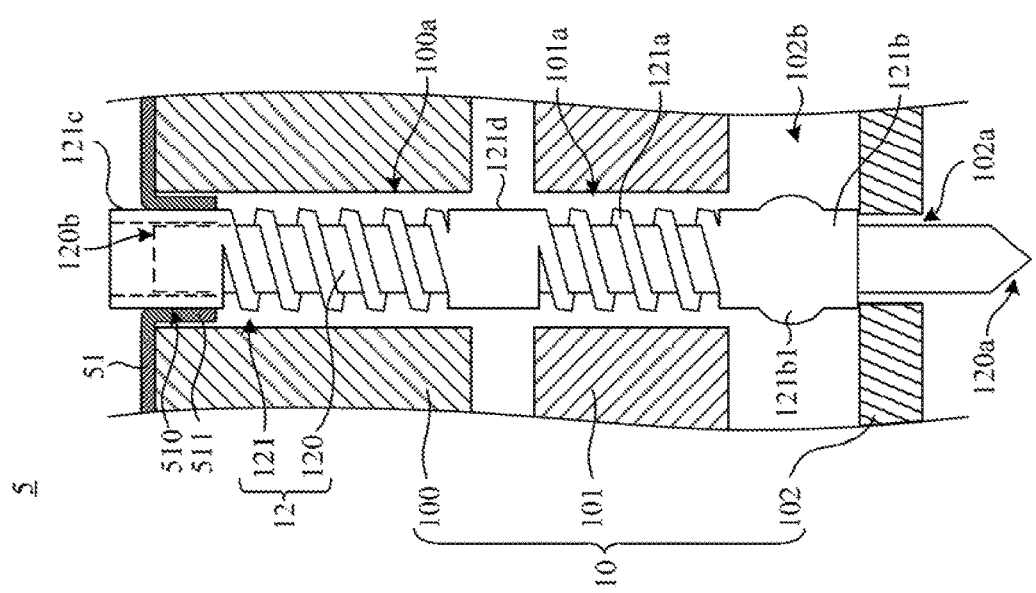
FIG. 7 is a partial cross-sectional view of a probe head according to another embodiment of the disclosure.

Reference is made to FIGS. 7 and 8. FIG. 7 is a partial cross-sectional view of a probe head 5 according to another embodiment of the disclosure. FIG. 8 is a partial top view of the film 51 in FIG. 7. As shown in the figures, compared with the probe head 1 shown in FIG. 1, the film 51 of the probe head 5 of the embodiment is located at a side of the first guiding board 100 away from the second guiding board 101, and the structure of the film 51 of the embodiment is modified. Specifically, in the embodiment, the film 51 further has a plurality of extending portions 511. The extending portions are formed at the inner wall of the micro hole 510 and configured to abut against the second non-spring area 121c of the outer spring sleeve 121 so as to apply clamping forces onto the probe assembly 12 towards the central axis CA. The above structural configuration also can achieve the purposes of retaining the bonding section 121b1 of the first non-spring area 121b between the third guiding board 102 of the probe base 10 and the film 51 and preventing the probe assembly 12 from falling out of the installation hole of the probe base 10.

The structures and functions of other components included in the probe head 5 of the present embodiment and relationships among the components are similar to those of the probe head 1 of FIG. 1 and therefore are not repeated here to avoid duplicity.

In practical applications, the film 51 can be modified to be disposed between the first guiding board 100 and the second guiding board 101. Alternatively, the film 51 can be modified to be disposed between the second guiding board 101 and the third guiding board 102. As a result, the purpose of preventing the probe assembly 12 from falling out of the installation hole of the probe base 10 can also be achieved by using the film 51.

In addition, in practical applications, the film 51 can works without the above extending portions 511, and the inner wall of the micro hole 510 and the second non-spring area 121c of the outer spring sleeve 121 form an interference fit, which also can achieve the purposes of retaining the bonding section 121b1 of the first non-spring area 121b between the third guiding board 102 of the probe base 10 and the film 51 and preventing the probe assembly 12 from falling out of the installation hole of the probe base 10.

Figure 9:
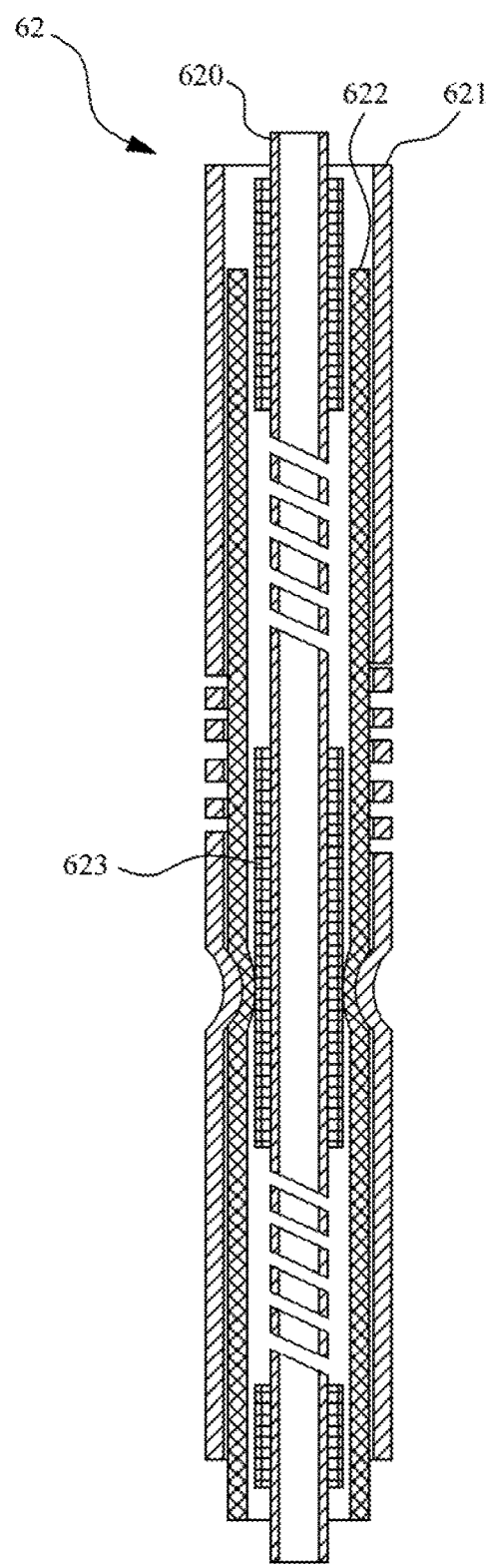
FIG. 9 is a cross-sectional view of a probe assembly according to another embodiment of the disclosure.
Figure 10:
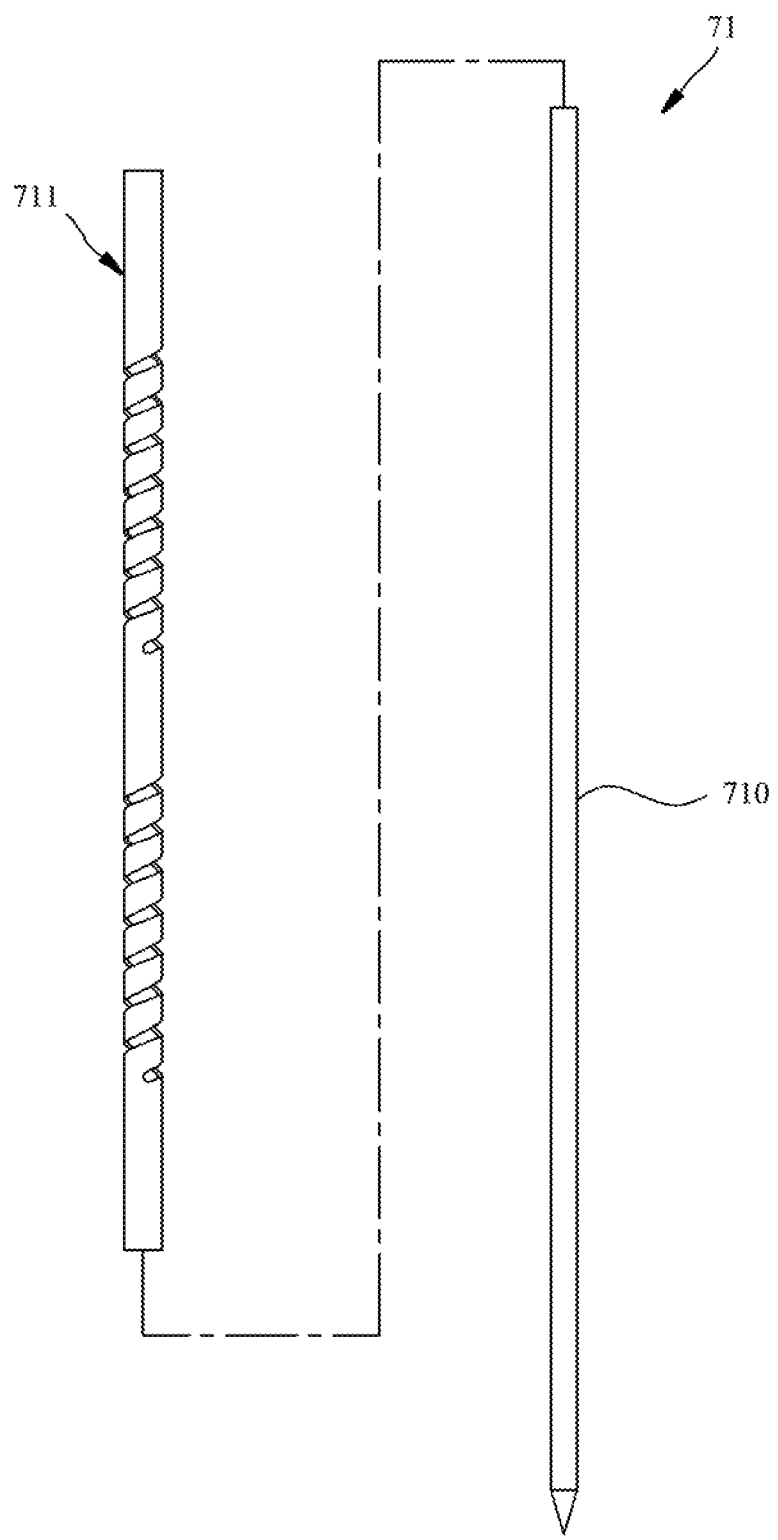
FIG. 10 is an exploded view of a conventional probe assembly.
Figure 11:
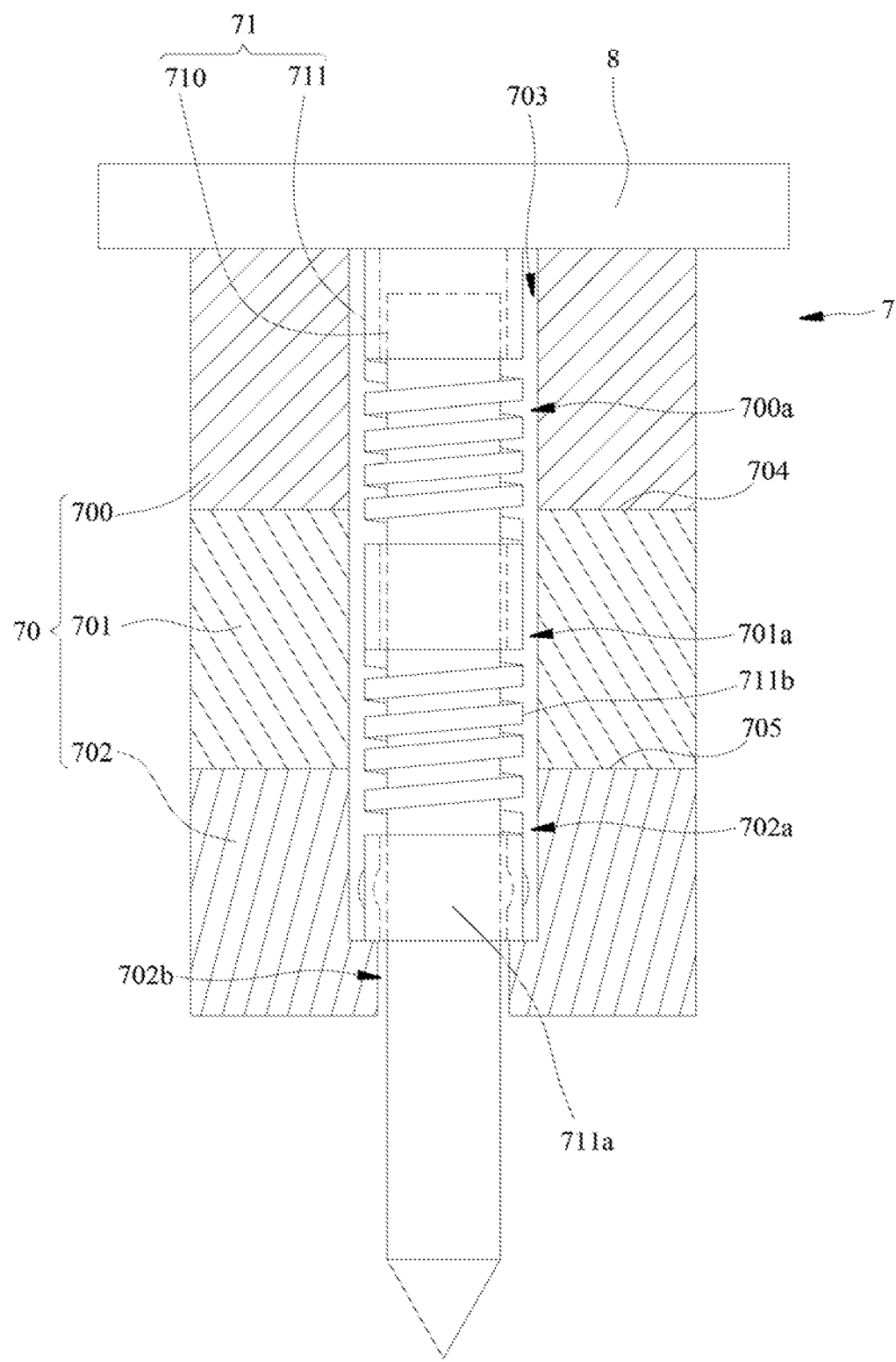
FIG. 11 is a partial cross-sectional view of a probe card adopted in the probe assembly.

Reference is made to FIG. 9. FIG. 9 is a cross-sectional view of a probe assembly 62 according to another embodiment of the disclosure. As shown in the figure, in the embodiment, the probe assembly 62 has a probe, an outer spring sleeve 621, an intermediary sleeve 622, and an insulating film 623. The outer spring sleeve 621 is disposed at the outermost of the probe assembly 62, the intermediary sleeve 622 is disposed at the inner side of the outer spring sleeve 621, and the probe is disposed at the innermost of the probe assembly 62. Specifically, compared with the above embodiments, the probe of the present embodiment is an inner spring sleeve 620. Therefore, it can be seen that the probe assembly 62 is constituted by three tubular members that have different diameters and are concentric. To fix the outer spring sleeve 621 and the intermediary sleeve 622, the outer spring sleeve 621 can be inwardly pressed to the intermediary sleeve 622. Alternatively, the outer spring sleeve 621 and the intermediary sleeve 622 can be fixed to each other by using fixing approaches such as laser beam welding, arc welding, or using adhesives. To fix the intermediary sleeve 622 and the inner spring sleeve 620, the intermediary sleeve 622 can be inwardly pressed to the inner spring sleeve 620. Alternatively, the intermediary sleeve 622 and the inner spring sleeve 620 can be fixed to each other by using fixing approaches such as using adhesives. The intermediary sleeve 622 and the inner spring sleeve 620 can be connected to each other through the insulating film 623, so as to insulating the intermediary sleeve 622 and the inner spring sleeve 620. The insulating film 623 can be formed at the outer surface of the inner spring sleeve 620 or at the inner surface of the intermediary sleeve 622.

According to the foregoing recitations of the embodiments of the disclosure, it can be seen that the film is disposed in the probe base of the probe head of the present disclosure, and the bonding section of the probe assembly is retained between one of the guiding boards of the probe base and the film, so as to prevent the probe assembly from falling out of the installation hole of the probe base. In other words, the probe head of the present disclosure can prevent the probe assembly from falling due to unexpected accidents. While assembling or repairing, staff members do not have to tilt or place the whole probe card upside down (i.e., making the installation hole of the probe base face upwards) to disassemble the probe head, so as to improve the efficiency of assembling and repairing. In addition, by disposing the film between two of the guiding boards adjacent to the bonding section of the probe assembly (especially between a location of the first guiding board adjacent to the second guiding board and the third guiding board), the stroke that the probe assembly leaves the installation hole of the probe base can be effectively reduced. Furthermore, under the circumstances that the film is disposed between two guiding boards, the micro hole of the film not only can produce a positioning effect to the probe assembly, but also can prevent the spring area of the outer spring sleeve from getting stuck in the installation hole due to the unevenness at the inner wall (e.g., the guiding holes of any adjacent two guiding boards are not flushed with each other at the junction caused by the assembly errors) of the installation hole.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing it is intended that the present disclosure cover modifications and variations of this disclosure provided they fall within the scope of the following claims.

What is claimed is:

1. A probe head, comprising:
   a probe base comprising a first guiding board, a second guiding board, and a third guiding board, the second guiding board being disposed between the first guiding board and the third guiding board, the first guiding board having a plurality of first guiding holes, the second guiding board having a plurality of second guiding holes, the third guiding board having a plurality of third guiding holes and having an accommodating space at a side facing the second guiding board;
   a film fixed to the probe base and having a plurality of micro holes; and
   a plurality of probe assemblies each passing through a corresponding one of the first guiding holes, a corresponding one of the second guiding holes, a corresponding one of the third guiding holes, and a corresponding one of the micro holes, and comprising:
      a probe having a tip passing out through the third guiding board, and having a central axis; and
      an outer spring sleeve sleeved at the exterior of the probe and having at least one spring area and a plurality of non-spring areas, the at least one spring area being disposed between adjacent two of the non-spring areas, one of the non-spring areas having a bonding section mounted to the probe and retained between the third guiding board and the film, the corresponding one of the third guiding holes being configured to allow the tip to pass through and block the outer spring sleeve,
   wherein the bonding section has a width in a direction perpendicular to the central axis, the width is greater than a hole diameter of the corresponding one of the micro holes, the spring area and the non-spring areas have an outer diameter in the direction, the hole diameter of the corresponding one of the micro holes is greater than the outer diameter, and the film is located between the bonding section and the second guiding board,
   wherein the bonding sections of the plurality of probe assemblies are accommodated in the accommodating space.

2. The probe head of claim 1, wherein the film further has a plurality of recesses, and the recesses are equidistantly formed at the inner wall of the corresponding one of the micro holes.

3. The probe head of claim 2, wherein the quantity of the recesses is an odd number.

4. The probe head of claim 1, wherein when the outer spring sleeve abuts against the third guiding board, the film is located at one of the non-spring areas.

5. The probe head of claim 4, wherein when the outer spring sleeve abuts against the third guiding board, the film is located between a location on the first guiding board adjacent to the second guiding board and the third guiding board.

6. The probe head of claim 5, wherein the film is located at the non-spring area having the bonding section.

7. The probe head of claim 1, wherein the film is a flexible substrate.

* * * * *